United States Patent
Bessot

[11] Patent Number: 5,940,318
[45] Date of Patent: Aug. 17, 1999

[54] ANTIRADIATION STATIC MEMORY CELL

[75] Inventor: Denis Bessot, Brignoud, France

[73] Assignee: STMicroelectronics S.A., Saint Genis, France

[21] Appl. No.: 09/132,590

[22] Filed: Aug. 11, 1998

[30] Foreign Application Priority Data

Aug. 12, 1997 [FR] France .................................. 97 10454

[51] Int. Cl.⁶ .................................................. G11C 11/00
[52] U.S. Cl. ............................................ 365/154; 365/156
[58] Field of Search ..................... 365/154, 156, 365/190

[56] References Cited

U.S. PATENT DOCUMENTS

| | | | |
|---|---|---|---|
| 4,852,060 | 7/1989 | Rockett, Jr. .............................. | 365/154 |
| 5,043,939 | 8/1991 | Slamowitz et al. ..................... | 365/154 |
| 5,111,429 | 5/1992 | Whitaker ................................. | 365/156 |
| 5,640,341 | 6/1997 | Bessot et al. ........................... | 365/156 |

FOREIGN PATENT DOCUMENTS 2 702 874   9/1994   France  .......................... G11C 11/412

*Primary Examiner*—David Nelms
*Assistant Examiner*—VanThu Ngruyen
*Attorney, Agent, or Firm*—Wolf, Greenfield 7 Sacks, P.C.

[57] ABSTRACT

The present invention relates to a memory cell including two sets each including first and second transistors connected between high and low potentials, the first transistor being a P-channel transistor and the second one an N-channel transistor. Both sets include a third and a fourth N-channel transistor. The third transistor is connected between the high potential and the control electrode of the second transistor. The fourth transistor is connected between the low potential and the control electrode of the second transistor. The drains of the first and second transistors of each set form storage nodes. The sources and drains of the third and fourth transistors form input/output nodes, distinct from the storage nodes.

4 Claims, 1 Drawing Sheet

ANTIRADIATION STATIC MEMORY CELL

BACKGROUND OF THE INVENTION

1. Field of the Invention

The present invention relates to static memory cells and, more specifically, to memory cells, the state of which is not modified by the collision of heavy ions on a sensitive area of the cell.

2. Discussion of the Related Art

Electronic equipment can, in certain conditions, especially in space, be submitted to particle bombardment, in particular by heavy ions. When the drain of a MOS-type transistor biased in a determined way is crossed by a heavy ion, the MOS transistor generates a parasitic pulse on its drain. Such a disturbance phenomenon, currently called upset phenomenon, can have disturbing effects, and especially change the state of the memory cell due to the parasitic effect on various transistors of the cell.

International patent application WO 94/22144 illustrates from page 1-line 15 to page 3-line 26, FIGS. 1A and 11B, a conventional static memory cell. It includes MOS-type transistors forming two inverters mounted head-to-tail. These transistors store a binary logic state and its complementary state. The cell further includes two access lines to write into or read from the cell. The inverters are supplied with a high supply potential Vdd and with a low supply potential Vss. Each inverter is formed by a P-channel transistor and an N-channel transistor, connected in series. The sources of the P-channel and N-channel transistors receive, respectively, potential Vdd and potential Vss. Their drains are interconnected and form the inverter output. Their control gates are interconnected and form the inverter input. A high logic state, noted "1", will correspond to a potential substantially equal to high supply potential Vdd. A low logic state, noted "0", will correspond to a potential substantially equal to low supply potential Vss.

The sensitive transistors are, generally, the N-channel transistors in the off state, the drains of which are at a potential close to high supply potential Vdd, and the P-channel transistors in the off state, the drains of which are at a potential close to low supply potential Vss. In the case of an N-channel transistor, if a heavy ion crosses the depleted area located in the vicinity of the drain, a negative pulse is generated, and the potential thereof is momentarily drawn to potential Vss. Conversely, in the case of a P-channel transistor, a positive parasitic pulse is generated on its drain, and the potential thereof is momentarily drawn to potential Vdd. There then exists a risk of modification of the states of the transistors forming the memory cell, and of a modification of the state of the datum stored in this cell. To minimize this risk of modification, it has been attempted to make so-called hardened memory cells, which are not sensitive to radiation.

A first solution is of technological nature and aims at making transistors which are intrinsically not sensitive to the effects of radiation. A disadvantage of this type of solution is that it is generally difficult to implement. It is also expensive, since it is necessary to develop and use for production specific technologies.

A second solution provided in U.S. Pat. No. 5111429 consists of using redundant memories. This solution has two significant disadvantages. It generates a significant increase in the silicon surface area, for an equal storage capacity. It also generates high power consumption.

A third solution, provided for example in patent application WO 94/22144, consists of modifying the architecture of the memory cells to minimize the risk of modification of the stored states. Typically, the modification of the architecture consists of adding additional transistors (six, for patent application WO 94/22144). This third solution thus generally has a disadvantage in terms of occupied silicon surface and of consumed current.

SUMMARY OF THE INVENTION

An object of the present invention is to provide a hardened memory cell having a low probability of corruption upon heavy ion bombardment.

Another object of the present invention is to provide a cell which is relatively inexpensive in terms of silicon surface.

Another object of the present invention is to provide a cell having low power consumption.

For this purpose, it is provided to modify the conventional memory cell architecture by adding only four N-channel transistors. The present invention thus appears as an improvement of the third solution.

Thus, the present invention provides a static memory cell to store, in differential form, a datum present on at least one data line. The datum is stored in differential form in two sets, on two complementary storage nodes associated with the sets. This datum is accessible via two complementary input/output nodes associated with the sets. One at least of these input/output nodes is accessible from the data line to read and/or write the datum. Both sets each include first and second transistors connected in series between first and second supply potentials. The first transistor and the second transistor are of different type. The two storage nodes are formed by the connection nodes between the first and second transistors of the two sets. The output node of each set is formed by a control electrode of the second transistor of the other set. The storage node of each set is connected to a control electrode of the first transistor of the other set. Both sets include a third transistor of the same type as the second transistor. The third transistor is connected between the first supply potential and a control electrode of the second transistor of the set. A control electrode of this third transistor is connected to the storage node of the other set. Both sets include a fourth transistor of the same type as the second transistor. The fourth transistor of each set is connected between the second supply potential and a control electrode of the second transistor of the set. A control electrode of this fourth transistor is connected to the output node of the set.

According to an embodiment, the cell includes an access transistor connected between the data line and the input/output node of one of the sets. A control electrode of this access transistor receives a read/write signal.

According to an embodiment, the cell includes two access transistors connected between, on the one hand, the data line and a complementary data line and, on the other hand, the input/output nodes of the sets. A control electrode of these access transistors receives a read/write signal.

According to an embodiment, the first transistor of each set is of P-channel MOS type, and the second, third and fourth transistors of each set are of N-channel MOS type.

BRIEF DESCRIPTION OF THE DRAWINGS

The foregoing as well as other objects, features and advantages of the present invention will be discussed in detail in the following non-limiting description of an example of the present invention in connection with FIG. 1 which shows an example of a memory cell according to the present invention.

DETAILED DESCRIPTION

Figure 1:
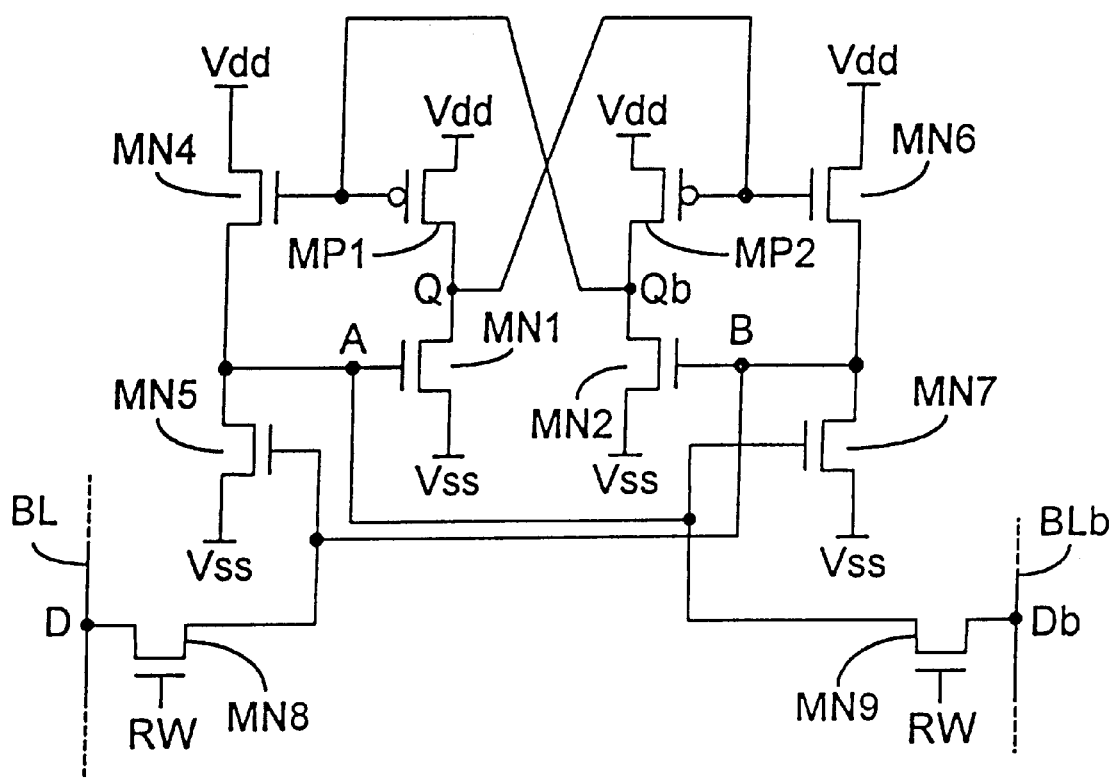

1—Structure of the Memory Cell.

FIG. 1 shows an example of a memory cell according to the present invention, implemented in MOS technology.

The cell includes a first and a second set. Each set includes a first P-channel and a second N-channel MOS-type transistor, respectively, connected in series between a high supply potential Vdd and a low supply potential Vss.

Two complementary storage nodes Q and Qb, associated with the sets, allow storage of a binary datum D in differential form. This datum D is stored in differential form. Node Q stores the state of datum D. Node Qb stores the state of a complementary datum Db, this state being the inverse of the state of datum D. A high logic state, noted "1", will correspond to a potential substantially equal to high supply potential Vdd. A low logic state, noted "0", will correspond to a potential substantially equal to low supply potential Vss.

Complementary input/output nodes B and A, respectively associated with the first and second sets, enable writing and reading data D and Db stored in the cell. Input/output node A enables writing and reading the state of datum D. Input/output node B enables writing and reading the state of complementary datum Db. In the illustrated example, these data are supplied to the input/output nodes (and received, in readings) over a data line BL and a complementary data line BLb. These data lines are respectively connected to nodes B and A. Data lines BL and BLb provide or receive, respectively, data D and Db. As will be seen hereafter, a single data line can be used to access to the memory cell, which limits the bulk of this cell and of the associated read and write devices.

The first set includes a first P-channel transistor MP1 and a second N-channel transistor MN1. The source of transistor MP1 receives high supply potential Vdd. The drain of transistor MP1 is connected to the drain of transistor MN1. The source of transistor MN1 receives low supply potential Vss. Storage node Q is the connection node of transistors MP1 and MN1 which connection node corresponds to the drains of these transistors. The second set includes a first P-channel transistor MP2 and a second N-channel transistor MN2. The source of transistor MP2 receives high supply potential Vdd. The drain of transistor MP2 is connected to the drain of transistor MN2. The source of transistor MN2 receives low supply potential Vss. Storage node Qb is the connection node of transistors MP2 and MN2, which connection node corresponds to the drains of these transistors.

It is important, as will be seen hereafter, that the conductance of transistors MN1 and MN2 is higher than that of transistors MP1 and MP2. The channel width to channel length ratios will be chosen accordingly. This ratio can for example be the same for all transistors, given the higher conductance of the N-channel transistors, for an equal dimension. Further, to ensure a symmetry of the sets, transistors MP1 and MP2, on the one hand, and transistors MN1 and MN2, on the other hand, will be chosen to have similar characteristics.

The first set also includes third and fourth N-channel transistors MN4 and MN5, connected in series between high supply potential Vdd and low supply potential Vss. Transistor MN4 receives potential Vdd on its drain. The source of transistor MN4 is connected to the drain of transistor MN5 and to the control electrode (also called control gate) of transistor MN1. The control electrode of transistor MN4 is connected, on the one hand, to the control electrode of transistor MP1 and, on the other hand, to the storage node of the second set, Qb. The control electrode of transistor MN5 is connected to the control electrode of transistor MN2. Input/output node A of the second set is formed by the source and the drain of transistors MN4 and MN5.

The second set also includes third and fourth N-channel transistors MN6 and MN7, connected in series between high supply potential Vdd and low supply potential Vss. Transistor MN6 receives potential Vdd on its drain. The source of transistor MN6 is connected to the drain of transistor MN7 and to the control electrode of transistor MN2. The control electrode of transistor MN6 is connected, on the one hand, to the control electrode of transistor MP2 and, on the other hand, to storage node Q. The control electrode of transistor MN7 is connected to the control electrode of transistor MN1. Input/output node B is the node formed by the source and the drain of transistors MN6 and MN7.

Noting 2W/L the channel width/length ratio of transistors MN1 and MN2, transistors MN5 and MN7 of ratio 2W/L and transistors MN4 and MN6 of lower ratio (for example, $W/L=\frac{1}{2}*2W/L$) can be chosen. In other words, the conductance of transistors MN4 and MN6 is lower than that of transistors MN5 and MN7. As with transistor pairs (MP1, MP2) and (MN1, MN2), transistors MN4 and MN6, on the one hand, and transistors MN5 and MN7, on the other hand, will be chosen to have similar characteristics. A symmetry of the sets forming the memory cell is thus ensured.

With respect to a conventional memory cell, the controls of the transistors forming, in a conventional cell, the head-to-tail connected inverters, are differentiated. In a conventional cell, the storage nodes and the input/output nodes are the same.

In the cell according to the present invention, the drains of transistors MP1 and MP2 are connected to nodes Q and Qb which behave as storage nodes for stored data D and Db. Transistors MN1 and MN2 are controlled by nodes A and B which behave as input/output nodes. The storage nodes and the input/output nodes are thus differentiated. As will be seen hereafter, the storage node which is in the high state controls the maintaining to the high state of the corresponding input/output node. The latter controls the maintaining to the low state of the other input/output node and of the other storage node. This second storage node contributes to maintaining the first storage node to the high state.

The storage cell finally includes two access transistors MN8 and MN9. These transistors receive, on their control electrodes, a read/write signal RW which turns them on or off. In the example illustrated, transistors MN8 and MN9 are N-channel transistors. Accordingly, they are on when signal RW is in the high state and off otherwise. P-channel transistors could possibly be used as access transistors.

The channel of access transistor MN8 is connected between input/output node B and data line BL. The channel of access transistor MN9 is connected between input/output node A and complementary data line BLb.

2—Reading of Datum D.

2.1—Reading of a "0".

It will be assumed that it is desired to read a datum stored in the memory cell, this datum being characterized by Q=0 and Qb=1.

Since Q=0, transistor MP2 is on, which maintains Qb at 1. Transistor MP1 is thus off. Transistor MN6 is also off.

Transistor MN4 is on. Node A is at potential Vdd−Vt, noting Vt the threshold voltage of transistor MN4. Transistors MN1 and MN7 are thus on (assuming, of course, that Vdd—Vt is higher than the threshold voltages of transistors MN1 and MN7). Transistor MN7 being on, the potential of input/output node B is substantially equal to potential Vss. Transistors MN2 and MN5 are thus off.

To read complementary data D and Db stored in the memory cell, the access transistors are turned on by positioning signal RW to the high state. Data lines BL and BLb will thus be connected to input/output nodes B and A, the potentials of which are representative of the states of D and Db. Indeed, neglecting the losses induced by the transistors of the memory cell, the potentials of node Q and B are substantially equal, as well as potentials Qb and A. Thus, line BL will be brought to potential Vss and line BLb will be brought to potential Vdd—Vt.

2.2—Reading of a "1".

This example will not be described in detail. It is enough to refer to the above example, assuming that the off transistors are then on, and conversely.

3—Writing of Datum D.

The writing into the memory cell will now be considered.

As will be seen, transistors MN1 and MN2 are those mainly used to modify the stored differential datum.

3.1—Writing of a "0".

It will be assumed that it is desired to store D=0 into the memory cell (then, Db=1).

If the datum previously present was a "0", there will be no modification in the cell, the nodes then remaining at the potentials that they occupied before the writing.

It will be assumed that the previously stored datum was a "1". Then, Q=1 and Qb=0. The potential of node A is equal to Vss, and the potential of node B is close to Vdd. Transistors MP1, MN6, MN2, and MN5 are on. Transistors MP2, MN4, MN1, and MN7 are off.

To modify the states of nodes Q and Qb, transistors MN1 and MP2 have to be turned on, and transistors MP1 and MN2 have to be turned off. For this purpose, line BL is positioned to potential Vss and line BLb is positioned to potential Vdd. Then, the access transistors are turned on.

When transistor MN8 turns on, the potential of node B tends to be brought back to Vss by means of access transistor MN8. Transistor MN6 tends, however, to maintain the potential of node B at Vdd-Vt. Typically, the data lines are connected to transistors which enable to impose state "1" or state "0" on these lines, when it is desired to write a datum into the cell. For this purpose, the data lines could for example be connected to conventional CMOS inverters, formed of a P-channel transistor and of an N-channel transistor. If the previously stored datum in the write mode is the inverse of the datum to be written, the potential of one of the input/output nodes of the cell can be brought back to a value close to Vss. Assuming that the data line connected to this node is connected to Vss by means of an N-channel transistor, it could be shown that it is enough, for the states stored in the cell to be able to be modified, that the channel width/length ratios of this N-channel transistor and of the access transistor corresponding to this line are equal to that of transistor MN4 or MN6 corresponding to this node.

Transistor MN5 turns off when its control electrode receives a potential lower than its threshold voltage.

The potential of node A can then increase, by means of transistor MN4, and transistor MN1 turns on. The potential of node Q then tends to decrease. Transistor MP1 opposes to transistor MN1. However, since the conductance of transistor MN1 is higher, the potential of node Q will be brought to the level of Vss. Accordingly, transistor MP2 will turn on and transistor MN6, on the contrary, will turn off.

Concurrently to transistor MN1, transistor MN7 turns on. Since transistor MN7 has a higher conductance than that of transistor MN6, this transistor will bring the potential of node B to the level of Vss, which turns off transistor MN2. Since transistor MN2 can no longer oppose to transistor MP2, the potential of Qb will increase to reach Vdd. Transistor MP1 will thus turn off and, concurrently, transistor MN4 will bring the potential of node A to Vdd-Vt.

Transistor MN4 will maintain the state of node A when transistor MN9 is subsequently turned off, at the end of the writing. Transistor MN7 will maintain the state of node B when transistor MN8 is subsequently turned off, at the end of the writing.

3.2—Writing of a "1".

As previously, if the stored datum was already a "1", there is no modification in the memory cell. If the stored datum was a "0", it will be enough to refer to the above example by inverting the states of the transistors and of the nodes.

4—Disturbance of the Cell.

The behavior of the memory cell during a disturbance will now be considered, more specifically considering nodes Q and A. Since the cell structure is symmetrical, the described examples will easily be extended to the case of disturbances on nodes Qb and B.

4.1—Positive Pulse on Node Q.

Assume that Q=0 and Qb=1, and that a positive disturbance appears on storage node Q. This disturbance will translate as a parasitic positive pulse on this node, that is, as an abrupt increase of the potential on the drain of transistor MP1.

Transistor MP2 will turn off. Node Qb is then floating and maintains state "1" by capacitive effect. Concurrently, transistor MN6 turns transiently on and the potential of node B slightly increases. Since the conductance of transistor MN7 is higher than that of transistor MN6, this increase of the potential of node B is not sufficient to reach the conduction threshold of transistor MN2, and this, independently from the duration or amplitude of the positive pulse. The potential of node Qb is thus not modified, once the pulse has disappeared by discharge of node Q through transistor MN1.

Since transistor MN7 is on during the pulse, it opposes the increase of the potential of node B. It may further be all the more conductive as the amplitude of the parasitic pulse is higher than Vdd. Indeed, in this case, the potential on the drain of transistor MP1 is higher than the potential on its control electrode. Potential Vdd will thus tend to increase, by discharge of node Q through transistor MP1. Thereby, the potential of node A will also increase, which can induce an increase of the conductance of transistor MN7, if this conductance is not already at its maximum.

4.2—Negative Pulse on Node Q.

Assume that Q=1 and Qb=0, and that a negative disturbance appears on node Q. This disturbance will translate as a negative parasitic pulse on this node, that is, as an abrupt decrease of the potential on the drain of transistor MN1. This potential may possibly become lower than potential Vss.

Transistor MP2 will turn on and transistor MN6 will turn off. The potential of node Qb will then tend to increase. The potential of node B being maintained by capacitive effect, transistor MN2 remains on. Since the conductance of transistor MN2 is higher than that of transistor MP2, node Qb will be maintained to a potential close to potential Vss when transistor MP2 is on. Transistor MP1 will thus remain on, which brings node Q back to its initial potential.

As previously, there can be a decrease of potential Vss, if the potential on the drain of transistor MN1 becomes lower than the potential of its control electrode. There then is a temporary inversion of the drains and sources of transistor MN1.

4.3—Negative Pulse on Node A.

Assume that Q=0 and Qb=A=1, and that a negative disturbance appears on node A. This disturbance will translate as a negative parasitic pulse on this node, that is, as an abrupt decrease of the potential on the drain of transistor MN5. This potential may possibly become lower than potential Vss.

Transistors MN7 and MN1 will turn off. Nodes Q and B are then floating and maintain their former state by capacitive effect. In other words, transistors MP2 and MN2 remain, respectively, on and off. Accordingly, the potential of node Qb is not modified and transistor MN4 is maintained in the on state. The potential of node A will thus be restored, by means of transistor MN4.

The hypothesis of a positive pulse on an input/output node will not be studied. Indeed, since the third and fourth transistors of the sets have N channels, a collision with a heavy ion cannot generate such a phenomenon.

As a conclusion, the cell according to the present invention, in which the storage nodes and the input/output nodes are differentiated, has a very good resistance to ion bombardings. A risk of modification of the cell content may possibly appear if two heavy ions simultaneously hit two sensitive nodes of the cell. However, the probability of occurrence of such an event is extremely low.

Further, it should be noted that the cell is particularly advantageous in terms of occupied surface area and of power consumption. As concerns the cell surface area, only four transistors are added for protection against the effects of bombardment. As concerns the power consumption, it only appears transiently, when the cell is written into or upon occurrence of a disturbance. The cell induces no static power consumption.

5—Cell with a Single Input/output Node.

The specific structure described hereabove may of course be modified without departing from the present invention, especially as concerns the transistor biasings and sizes.

An alternative of the described cell is, for example, to use the structure as described, but using a single data line. This amounts to removing the complementary data line and the corresponding access transistor and replacing them with an inverter. A less bulky memory cell can thus be available. Less bulky memories or registers can above all be implemented, since the number of data lines and of read/write devices associated with the data lines is divided by two.

It will be assumed, as an example, that only data line BL and access transistor MN8 are used. The control electrode of transistor MN7 and node A will then be connected to the output of an inverter having its input connected to node B.

As concerns the reading, no particular difference will be noted with respect to what has been described in relation with FIG. 1.

As concerns the writing, attention will be paid to the sizing of the transistors. Indeed, for the cell of FIG. 1, the access transistors have an N channel. The data line which will mainly trigger the switching of the node potentials is thus the line which provides a "0" to the cell. If a single data line is available, the writing of a "0" will thus raise no particular problem. However, if it is desired to write a "1", it will be necessary to make sure that the device providing this "1" (typically, a P-channel transistor) has a sufficient conductance with respect to transistor MN7, which tends to maintain the potential of node B to a value close to Vss. Indeed, a turning-off of transistor MN5 should be implementable to be able to turn off transistor MN7.

Further, if a conventional CMOS inverter is used, an additional sensitive node will be introduced in the cell, on the drain of the P-channel MOS transistor of this inverter. The possible parasitic pulses on this node being of positive type, the sizes of transistors MP1 and MN1 should be adapted accordingly, to avoid that a parasitic pulse induces changes of the stored states. In practice, the conductance of transistor MN1 will have to be decreased.

Of course, the present invention is likely to have various alterations, modifications, and improvements which will readily occur to those skilled in the art. As an example, nodes A and B may be used as inputs only and data output lines connected to nodes Q and Qb may be used to read the cell content. A single one of nodes Q and Qb may also be used as an output node, if, for example, a single input line is used, as mentioned hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A static memory cell to store, in differential form, a datum present on at least one data line, the datum being stored in differential form in two sets, on two complementary storage nodes associated with the sets, and this datum being accessible via two complementary input/output nodes associated with the sets, one at least of these input/output nodes being accessible from the data line to read and/or write the datum, both sets each including first and second transistors connected in series between first and second supply potentials, the first transistor and the second transistor being of different type, and the two storage nodes being formed by the connection nodes between the first and second transistors of the two sets, the output node of each set being formed by a control electrode of the second transistor of the other set, the storage node of each set being connected to a control electrode of the first transistor of the other set, both sets including a third transistor of same type as the second transistor, the third transistor being connected between the first supply potential and a control electrode of the second transistor of the set, and a control electrode of this third transistor being connected to the storage node of the other set, both sets including a fourth transistor of same type as the second transistor, the fourth transistor of each set being connected between the second supply potential and a control electrode of the second transistor of the set, and a control electrode of this fourth transistor being connected to the output node of the set.

2. The cell of claim 1, including an access transistor connected between the data line and the input/output node of one of the sets, a control electrode of this access transistor receiving a read/write signal.

3. The cell of claim 1, including two access transistors connected between, on the one hand, the data line and a complementary data line and, on the other hand, the input/output nodes of the sets, a control electrode of these access transistors receiving a read/write signal.

4. The cell of claim 1, wherein the first transistor of each set is of P-channel MOS type, and the second, third, and fourth transistors of each set are of N-channel MOS type.

* * * * *